(12) United States Patent
Womack et al.

(10) Patent No.: US 12,738,459 B2
(45) Date of Patent: Sep. 15, 2026

(54) IN SITU SURFACE COATING OF PROCESS CHAMBER

(71) Applicant: Lam Research Corporation, Fremont, CA (US)

(72) Inventors: Jeffrey Womack, Lake Oswego, OR (US); Karl Frederick Leeser, West Linn, OR (US); Curtis W. Bailey, West Linn, OR (US); Keith Joseph Martin, Tualatin, OR (US); Rigel Martin Bruening, Sherwood, OR (US); Nick Ray Linebarger, Jr., Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 406 days.

(21) Appl. No.: 17/796,406

(22) PCT Filed: Feb. 4, 2021

(86) PCT No.: PCT/US2021/016637
§ 371 (c)(1),
(2) Date: Jul. 29, 2022

(87) PCT Pub. No.: WO2021/158803
PCT Pub. Date: Aug. 12, 2021

(65) Prior Publication Data

US 2023/0052089 A1 Feb. 16, 2023

Related U.S. Application Data

(60) Provisional application No. 62/971,779, filed on Feb. 7, 2020.

(51) Int. Cl.
*H01J 37/32* (2006.01)
*C23C 16/44* (2006.01)
(Continued)

(52) U.S. Cl.
CPC .... *H01J 37/32477* (2013.01); *C23C 16/4404* (2013.01); *C23C 16/505* (2013.01);
(Continued)

(58) Field of Classification Search
None
See application file for complete search history.

(56) References Cited

U.S. PATENT DOCUMENTS 6,121,161 A 9/2000 Rossman et al.
6,455,333 B1 * 9/2002 Khathuria ......... H01L 21/32139 438/719
(Continued)

FOREIGN PATENT DOCUMENTS

CN 1983518 6/2007
CN 101506960 8/2009
(Continued)

OTHER PUBLICATIONS

"International Application Serial No. PCT US2021 016637, International Preliminary Report on Patentability mailed Aug. 18, 2022", 8 pgs.
(Continued)

*Primary Examiner* — Jeffrie R Lund
*Assistant Examiner* — Tiffany Z Nuckols
(74) *Attorney, Agent, or Firm* — Schwegman Lundberg & Woessner, P.A.

(57) ABSTRACT

A reactor system comprises a process chamber, a gas inlet, and a dispenser. The dispenser is coupled to the gas inlet. The dispenser controls a gas flow from a vial to the gas inlet. The vial includes a coating material that, when released inside the process chamber under operating conditions of the reaction system, coats an inner wall of the process chamber.

6 Claims, 8 Drawing Sheets

(51) Int. Cl.
*C23C 16/505* (2006.01)
*C23C 16/52* (2006.01)

(52) U.S. Cl.
CPC ........ *C23C 16/52* (2013.01); *H01J 37/32183* (2013.01); *H01J 37/32449* (2013.01); *H01J 2237/3321* (2013.01)

(56) References Cited

U.S. PATENT DOCUMENTS

| | | | | |
|---|---|---|---|---|
| 2011/0073463 | A1* | 3/2011 | Ye | C23C 14/0676 204/192.15 |
| 2016/0372308 | A1* | 12/2016 | Murakami | H01J 37/3244 |
| 2018/0374697 | A1* | 12/2018 | Agarwal | C23C 16/45536 |
| 2019/0368035 | A1 | 12/2019 | Malik et al. | |

FOREIGN PATENT DOCUMENTS

| | | | |
|---|---|---|---|
| CN | 102420139 | | 4/2012 |
| CN | 104143494 | | 11/2014 |
| CN | 104576305 | | 4/2015 |
| CN | 104651807 | | 5/2015 |
| CN | 115053015 | | 9/2022 |
| EP | 0387656 | A1 | 9/1990 |
| JP | 2011146596 | A | 7/2011 |
| JP | 2015122486 | A | 7/2015 |
| JP | 2023513102 | | 3/2023 |
| KR | 20050102215 | A | 10/2005 |
| KR | 20060027627 | A | 3/2006 |
| KR | 20160149151 | | 12/2016 |
| TW | 460943 | B | 10/2001 |
| TW | 201529141 | A | 8/2015 |
| TW | 202003903 | A | 1/2020 |
| TW | I904133 | B | 11/2025 |
| WO | WO-2019231599 | A1 | 12/2019 |

OTHER PUBLICATIONS

“Japanese Application Serial No. 2022-547033, Voluntary Amendment Filed Jan. 10, 2024”, w English Claims, 12 pgs.

“Korean Application Serial No. 10-2022-7030869, Voluntary Amendment filed Jan. 30, 2024”, only English claims, 4 pgs.

International Application Serial No. PCT/US2021/016637, International Search Report mailed May 31, 2021, 3 pgs.

International Application Serial No. PCT/US2021/016637, Written Opinion mailed May 31, 2021, 6 pgs.

Taiwanese Application Serial No. 110104484, Office Action mailed Aug. 20, 2024, w/ English translation, 27 pgs.

Taiwanese Application Serial No. 110104484, Response filed Nov. 19, 2024 to Office Action mailed Aug. 20, 2024, w/English claims.

Japanese Application Serial No. 2022-547033, Notification of Reasons for Refusal mailed Feb. 4, 2025, w/ English translation, 6 pgs.

Japanese Application Serial No. 2022-547033, Notification of Reasons for Refusal mailed Jul. 8, 2025, w/ English translation, 4 pgs.

Japanese Application Serial No. 2022-547033, Response filed May 2, 2025 to Notification of Reasons for Refusal mailed Feb. 4, 2025, w/ English Claims, 14 pgs.

“Korean Application Serial No. 10-2022-7030869, Notice of Preliminary Rejection mailed Oct. 30, 2025”, W English Translation, 13 pgs.

“Chinese Application Serial No. 202180013050.1, Office Action mailed Jul. 8, 2026”, W Machine English Translation, 24 pgs.

* cited by examiner

IN SITU SURFACE COATING OF PROCESS CHAMBER

CLAIM OF PRIORITY

This application is a U.S. National Stage Filing under 35 U.S.C. 371 from International Application No. PCT/US2021/016637, filed on Feb. 4, 2021, and published as WO 2021/158803 A1 on Aug. 12, 2021, which claims the benefit of priority to U.S. Patent Application Ser. No. 62/971,779, filed on Feb. 7, 2020, each of which is incorporated by reference herein in its entirety.

TECHNICAL FIELD

The present disclosure relates generally to a method for in-situ surface coating of a chamber, and in particular to systems and methods for coating an interior surface of the chamber during an operation of the process chamber.

BACKGROUND

As semiconductor processes deal with smaller geometries being defined on semiconductor substrates it is becoming more difficult to maintain the uniformity and accuracy of critical dimensions. Moreover, it has become increasingly important that the environment inside the processing chamber be consistent to ensure acceptable wafer to wafer variability of the critical dimensions. As is known in the art, many of the processes carried out within the semiconductor processing chambers leave deposits on the inner surfaces of the processing chamber. As these deposits accumulate over time, they can become a source of particulate contamination that is harmful to the substrates being processed. For example, the particulate contamination may flake off and fall onto the surface of the substrate if the particulate contamination is allowed to build up over time.

Although care and caution are involved during the monitoring of a chemical process, more often than not, undesired residues are deposited on the inner surfaces of the process chambers where the processes are taking place. The undesired residues, unfortunately, get deposited in and around the walls of the processing chamber. The build up of residues inside the processing chamber, over time, not only make the processes unreliable and shifted from baseline, but also result in degraded, defective substrates due to particulate contamination that builds up over time on the inner surfaces of the chamber. Without frequent cleaning procedures, impurities from the residue deposited on the chamber's inner surfaces can migrate onto the substrate. In addition, process etch rates or deposition rates can vary over time due to the changing chamber conditions from residue build-up resulting in out of control process performance. The buildup of deposits on the inner surfaces of the chamber causes an inconsistent environment which impacts the processing operation being performed. That is, the buildup of deposits increases with each processing operation. Thus, each successive processing operation does not initiate with the same chamber conditions. Accordingly, the changed starting conditions for each successive processing operation causes a variance that eventually exceeds acceptable limits, which results in etch rate drift, critical dimension drift, profile drift, etc.

One attempt to solve these issues includes applying a coating to a part during manufacture of the part and prior to installation in the processing chamber. However, the coating is not applied at the process temperature of the process chamber because the coating is applied prior to installation of the part in the processing chamber. As such, the coating can adversely react with the atmosphere and at the process temperature inside the process chamber. Furthermore, the coating on the part is exposed and vulnerable to damage before installation in the chamber.

Another attempt to solve the above issues includes applying a pre-coat layer during installation. However, the pre-coat layer is restricted to films conventionally deposited by the system. As such, a desired coating may not be the one run by the tool.

The background description provided here is for the purpose of generally presenting the context of the disclosed subject matter. Work of the presently named inventors, to the extent that it is described in this background section, as well as aspects of the description that may not otherwise qualify as prior art at the time of filing, are neither expressly nor impliedly admitted as prior art against the present disclosure. Consequently, the information described in this section is provided to offer the skilled artisan a context for the following disclosed subject matter and should not be considered as admitted prior art. The information described in this section is therefore provided to offer the skilled artisan a context for the following disclosed subject matter and should not be considered as admitted prior art.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures structural components, such as modules) are optional and may be combined or subdivided, and operations (e.g., in a procedure, algorithm, or other function) may vary in sequence or be combined or subdivided.

The term "a process chamber" is used herein to refer to a chamber or an enclosure used to process a substrate.

The term "substrate" is used herein to refer to a processing surface, such as a semiconductor wafer.

The term "gas inlet" is used herein to refer to a gas input connection to the process chamber.

The term "dispenser" is used herein to refer to a pump or a mechanism used to move gas, or to control a gas flow.

The term "vial" is used herein to refer to as container for storing gas.

The term "source gas line" is used herein to refer to a pipeline used to transport gas from a gas source.

The present disclosure describes a reactor system that comprises a process chamber, a gas inlet, and a dispenser. The dispenser is coupled to the gas inlet. The dispenser controls a gas flow from a vial to the gas inlet. The vial includes a coating material that, when released inside the process chamber under operating conditions of the reaction system, coats an inner wall of the process chamber.

Figure 1:
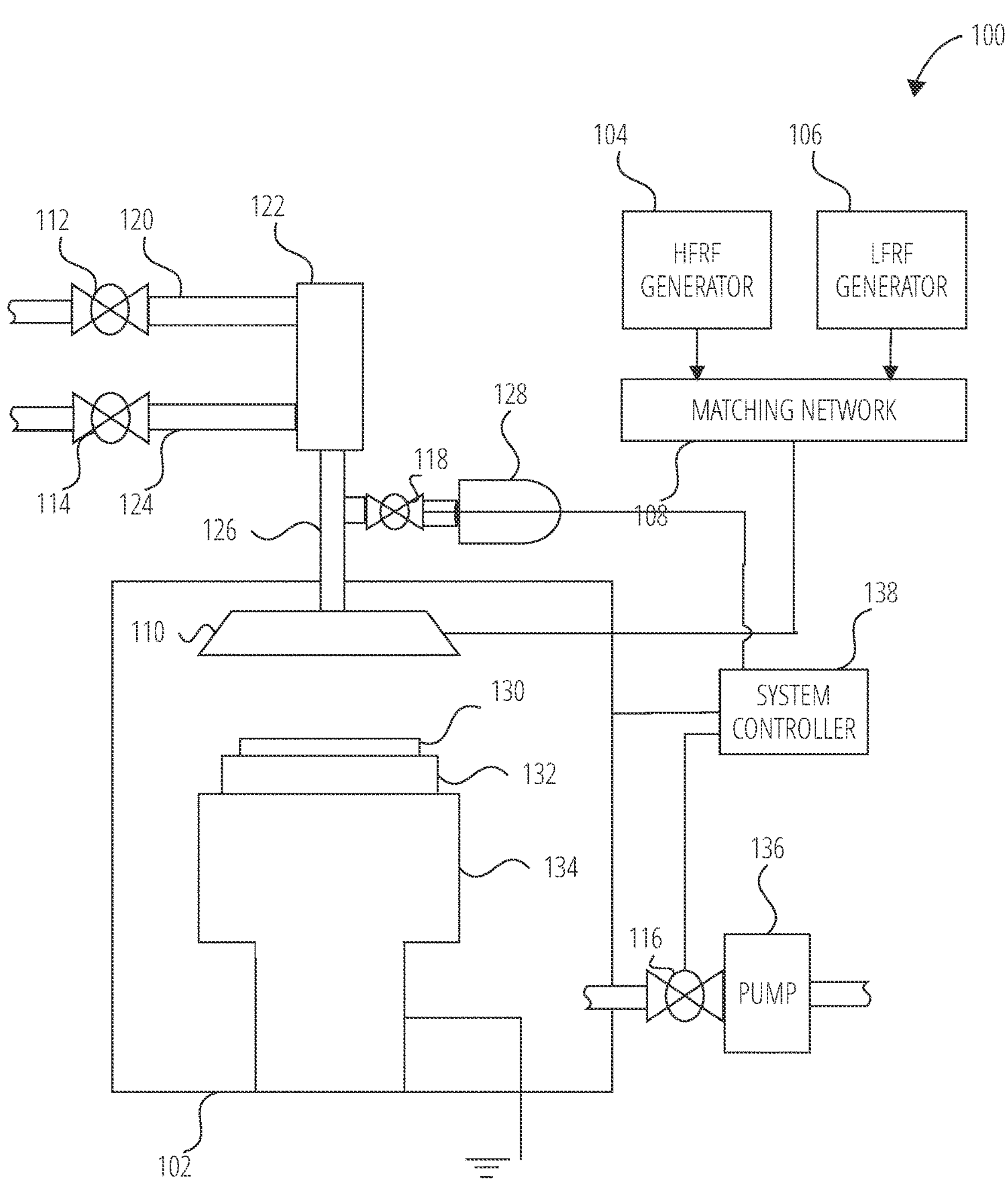
FIG. 1 illustrates an in-situ deposition system in accordance with one example embodiment.

FIG. 1 illustrates an in-situ deposition system in accordance with one example embodiment. As an example, deposition techniques provided herein may be implemented in a plasma-enhanced chemical vapor deposition (PECVD) reactor or a conformal film deposition (CFD) reactor. Such a reactor may take many forms and may be part of an apparatus that includes one or more chambers or reactors—sometimes including multiple stations—that may each house one or more wafers and may be configured to perform various wafer operations. The one or more chambers may maintain the wafer in a defined position or positions (with or without motion within that position, e.g., rotation, vibration, or other agitation). In one implementation, prior to operations performed in disclosed embodiments, a wafer undergoing film deposition may be transferred from one station to another within a reactor or chamber during the process. In other implementations, the wafer may be transferred from chamber to chamber within the apparatus to perform different operations. Full deposition or any fraction of the total film thickness for any deposition step may occur entirely at a single station. While in process, each wafer may be held in place by a pedestal, wafer chuck, and/or other wafer-holding apparatus. For certain operations in which the wafer is to be heated, the apparatus may include a heater, such as a heating plate. A Vector™ (e.g., C3 Vector) or Sequel™ (e.g., C2 Sequel) reactor, produced by Lam Research Corp. of Fremont, Calif., are both examples of suitable reactors that may be used to implement the techniques described herein.

FIG. 1 provides a block diagram depicting various reactor components arranged for implementing methods described herein. As shown, a reactor system 100 includes a process chamber 136 that encloses other components of the reactor system 100 and serves to contain plasma generated by a capacitive-discharge type system including a showerhead 108 working in conjunction with a grounded heater block 132. A high frequency (HF) radio frequency (RF) HFRF generator 102 and a low frequency (LF) radio frequency (RF) LFRF generator 104 is connected to a matching network 106 and to the showerhead 108. The power and frequency supplied by the matching network 106 may be sufficient to generate a plasma from source gases (also referred to as process gases) supplied to the process chamber 136. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the process chamber 136, a substrate support (e.g., a pedestal 130) supports a substrate (e.g., wafer 128). The pedestal 130 includes a chuck, a fork (not shown), or lift pins (not shown) to hold and transfer the wafer 128 into and out of the process chamber 136 between operations. The chuck may be an electrostatic chuck, a mechanical chuck, or various other types of chuck as are available for use in the industry and/or for research.

Multiple source gas lines (e.g., gas line 118, gas line 120) are connected to a manifold 122. The source gases may or may not be premixed. Corresponding valving and mass flow control mechanisms (e.g., valve 110, valve 116) may be employed to ensure that the correct source gases are delivered during the deposition and plasma treatment phases of each operation in the process. In the case where a chemical precursor(s) is delivered in liquid form, liquid flow control mechanisms may be employed. Such liquids may then be vaporized and mixed with source gases during transportation in a manifold heated above the vaporization point of the chemical precursor supplied in liquid form before reaching the process chamber 136. The gas inlet 124 introduces the combined source gases (e.g., combined source gases from gas line 118 and gas line 120) in the process chamber.

A dispenser 114 connects to the gas inlet 124. The dispenser 114 dispenses chemicals such as TMA, zinc, magnesium, or fluorine contained in a vial 126 that is coupled to the dispenser 114. In one example embodiment, the precursor in the vial 126 includes chemicals (e.g., TMA) that coat an interior wall of the process chamber 136. These coatings prevent diffusion and/or release of substrate materials (e.g., aluminum), prevent chemical attack (e.g., fluorine), provide desired electrical properties, or repair damage to the surface (e.g., from in situ cleans). In other examples, the vial 126 contains:

- TMA for the deposition of aluminum oxides and nitrides
- Volatile metals such as magnesium and zinc for increasing the surface concentrations of these metals for initial conditioning and re-conditioning
- Reactive chemicals (fluorine compounds) and solvents for cleaning As such, the dispenser 114 solves the problems of coatings applied outside the process chamber 136 because the coatings can be applied under the normal operating conditions of the reactor system 100. As such, the coating of the interior walls of the process chamber 136 cannot be damaged by handling or exposure to the atmosphere.

Process gases may exit process chamber 136 via an outlet 112. A vacuum pump 134 (e.g., a one or two stage mechanical dry pump and/or turbomolecular pump), may be used to draw process gases out of the process chamber 136 and to maintain a suitably low pressure within the process chamber 136 by using a closed-loop-controlled flow restriction device (not shown), such as a throttle valve or a pendulum valve.

As discussed above, the techniques for deposition discussed herein may be implemented on a multi-station or single station tool. In specific implementations, a 300 mm Lam Vectors tool having a 4-station deposition scheme or a 200 mm Sequel™ tool having a 6-station deposition scheme may be used. In some implementations, tools for processing 450 mm wafers may be used. In various implementations, the wafers may be indexed after every deposition process, or may be indexed after etching steps if the etching chambers or stations are also pad: of the same tool, or multiple depositions and treatments may be conducted at a single station before indexing the wafer. In some implementations, the wafers may be indexed after each layer is deposited, such as after an underlayer is deposited, or after an atomically smooth layer is deposited.

In some embodiments, an apparatus may be provided that is configured to perform the techniques described herein. A suitable apparatus may include hardware for performing various process operations as well as a system controller 138 having instructions for controlling process operations in accordance with the disclosed embodiments. The system controller 138 includes one or more memory devices and one or more processors communicatively connected with various process control equipment, e.g., valves, RF generators, wafer handling systems, etc., and configured to execute the instructions so that the apparatus will perform a technique in accordance with the disclosed embodiments, e.g., a technique such as that provided in the operations of FIG. 4. Machine-readable media containing instructions for controlling process operations in accordance with the present disclosure may be coupled to the system controller 138. The system controller 138 may be communicatively connected with various hardware devices, e.g., dispenser 114, mass flow controllers, valves, RF generators, vacuum pumps, etc. to facilitate control of the various process parameters that are associated with the deposition operations as described herein.

In some embodiments, the system controller 138 controls all of the activities of the reactor system 100. The system controller 138 may execute system control software stored in a mass storage device, loaded into a memory device, and executed on a processor. Alternatively, the control logic may be hard coded in the system controller 138. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. The system control software may include instructions for controlling the timing of dispensing chemicals from the vial 126, the timing of gas flows, wafer movement, RF generator activation, etc. as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor system 100. The system control software may be configured in any suitable way. For example, various process tool component subroutines or control objects may be written to control operation of the process tool components necessary to carry out various process tool processes. The system control software may be coded in any suitable computer readable programming language.

The system controller 138 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 138.

The method and apparatus described herein may be used in conjunction with lithographic patterning tools or processes such as those described below for fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step performed with a number of possible tools: (1) application of photoresist on a workpiece, substrate or multi-layer stack as provided in disclosed embodiments), using a spin-on or spray-on tool; (2) curing a photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferred the resist pattern into an underlying film or workpiece, such as an amorphous carbon underlayer, by using a dry or plasma-assisted etching tool; and (6) removing the resist using a tool such as an RF or microwave plasma resist stripper.

Figure 2:
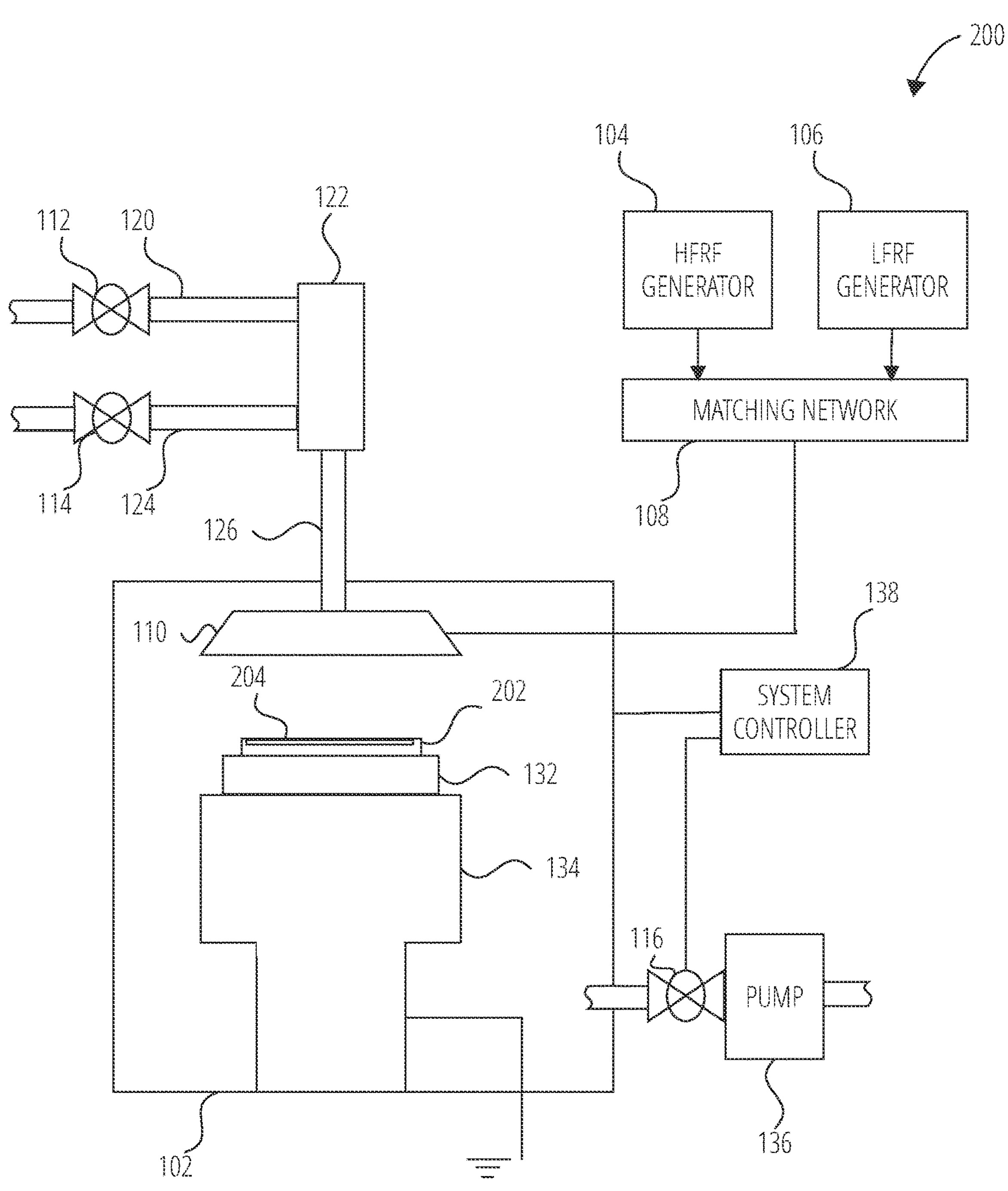
FIG. 2 illustrates an in-situ deposition system in accordance with another example embodiment.

FIG. 2 illustrates an in-situ deposition system in accordance with another example embodiment. The reactor system 100 includes a process chamber 136 that encloses other components of the reactor system 100 and serves to contain plasma generated by a capacitive-discharge type system including a showerhead 108 working in conjunction with a grounded heater block 132. A power supply includes a high frequency (HF) radio frequency (RF) HFRF generator 102 and a low frequency (LF) radio frequency (RF) LFRF generator 104. Both the HFRF generator 102 and the LFRF generator 104 are connected to a matching network 106. The matching network 106 is connected to a top electrode (e.g., the showerhead 108). The power and frequency supplied by the matching network 106 may be sufficient to generate a plasma from process gases supplied to the process chamber 136. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the process chamber 136, a pedestal 130 support a maintenance substrate 202. A coating material 204 is applied to a surface of the maintenance substrate 202. During a process of the reactor system 100, the coating material 204 is released from the maintenance substrate 202 and forms a film that coats the inner walls of the process chamber 136. The film provides benefits such as particle reduction or cleaning. In one example embodiment, the coating material 204 includes magnesium and zinc with a protective sacrificial oxide layer that can be removed by the process reactor.

Various process gases may be introduced via gas inlet 124. Multiple source gas lines (e.g., gas line 118, gas line 120) are connected to a manifold 122. The gases may or may not be premixed. Corresponding valving and mass flow control mechanisms (e.g., valve 110, valve 116) may be employed to ensure that the correct process gases are delivered during the deposition and plasma treatment phases of each operation in the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the process chamber 136.

Process gases may exit process chamber 136 via an outlet 112. A vacuum pump 134 (e.g., a one or two stage mechanical dry pump and/or turbomolecular pump), may be used to draw process gases out of the process chamber 136 and to maintain a suitably low pressure within the process chamber 136 by using a closed-loop-controlled flow restriction device (not shown), such as a throttle valve or a pendulum valve.

Figure 3:
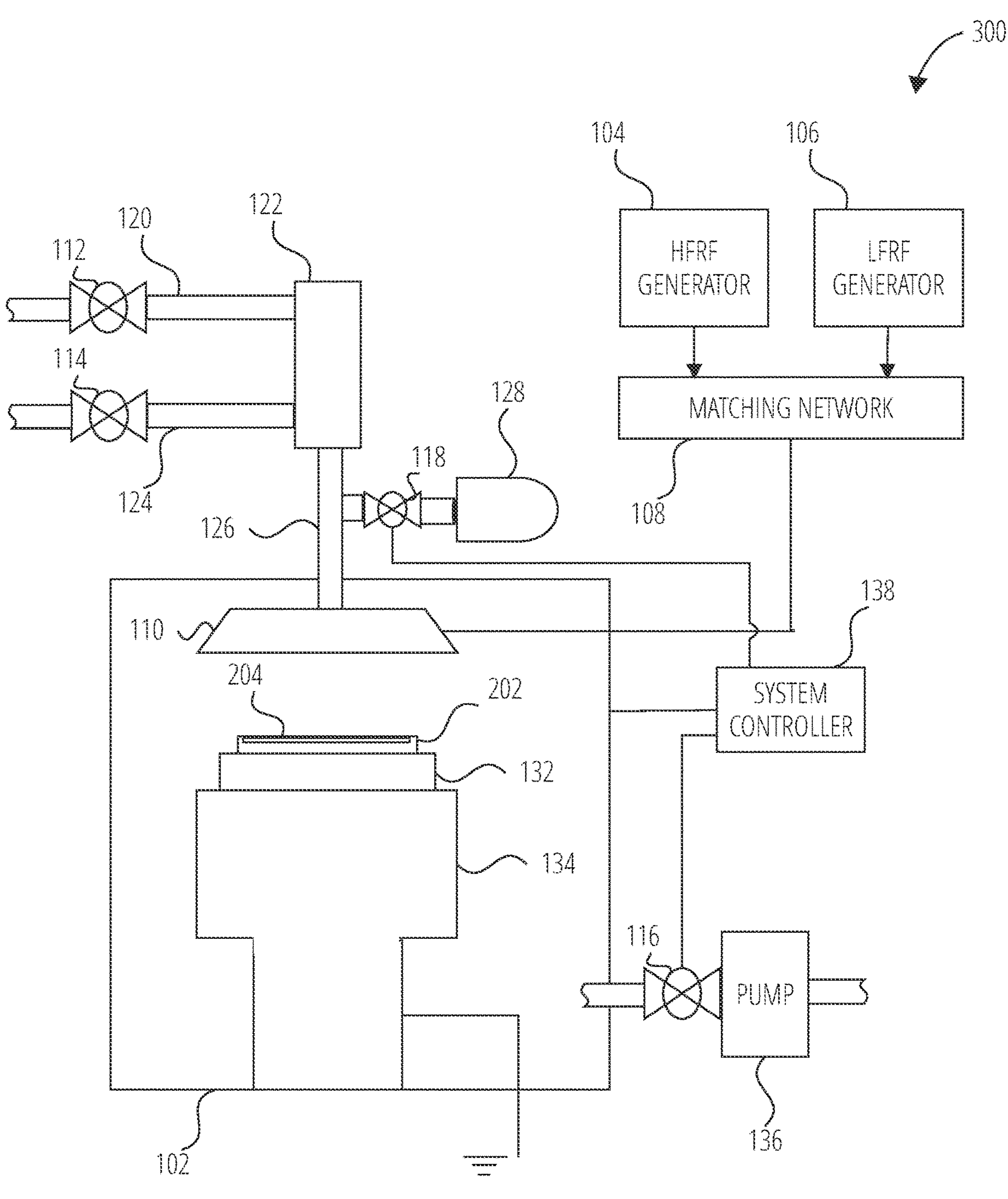
FIG. 3 illustrates an in-situ deposition system in accordance with another example embodiment.

FIG. 3 illustrates an in-situ deposition system in accordance with another example embodiment. The reactor system 300 combines elements of the reactor system 100 and the reactor system 200. In particular, the reactor system 300 includes the dispenser 114 and vial 126 of FIG. 1, and the maintenance substrate 202 and coating material 204 of FIG. 2. As such, the reactor system 200 combines a first coating material (from vial 126) with a second coating material (from the coating material 204) in the process chamber 136.

In some embodiments, an apparatus may be provided that is configured to perform the techniques described herein. A suitable apparatus may include hardware for performing various process operations as well as a system controller 138 having instructions for controlling process operations in accordance with the disclosed embodiments. The system controller 138 includes one or more memory devices and one or more processors communicatively connected with various process control equipment, e.g., dispenser 114, valves, RF generators, wafer handling systems, etc., and configured to execute the instructions so that the apparatus will perform a technique in accordance with the disclosed embodiments, e.g., a technique such as that provided in the operations of FIG. 6. Machine-readable media containing instructions for controlling process operations in accordance with the present disclosure may be coupled to the system controller 138. The system controller 138 may be communicatively connected with various hardware devices, e.g., dispenser 114, mass flow controllers, valves, RF generators, vacuum pumps, etc. to facilitate control of the various process parameters that are associated with the deposition operations as described herein.

In one example embodiment, the system controller 138 controls the dispenser 114 to adjust the gas flow from the vial 126 based on the coating material 204 in the maintenance substrate 202.

Figure 4:
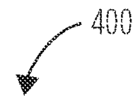
FIG. 4 is a flow diagram illustrating a method for an in-situ coating process in accordance with one example embodiment.
Figure 4:
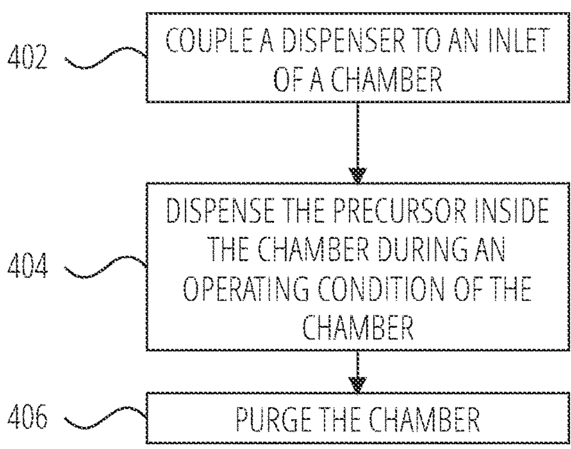

FIG. 4 is a flow diagram illustrating a method 400 for an in-situ coating process in accordance with one example embodiment. It is to be noted that other embodiments may use different sequencing, additional or fewer operations, and different nomenclature or terminology to accomplish similar functions. In some embodiments, various operations may be performed in parallel with other operations, either in a synchronous or asynchronous manner. The operations described herein were chosen to illustrate some principles of operations in a simplified form.

At block 402, a dispenser 114 is coupled to a gas inlet 124 of a process chamber 136. The dispenser 114 includes a coating material (e.g., a precursor). At block 404, the dispenser 114 dispenses the coating material inside the process chamber 136 during an operating condition of the process chamber 136. At block 406, gas inside the process chamber 136 is purged after the process (from the operating condition).

Figure 5:
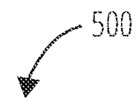
FIG. 5 is a flow diagram illustrating a method for an in-situ coating process in accordance with another example embodiment.
Figure 5:
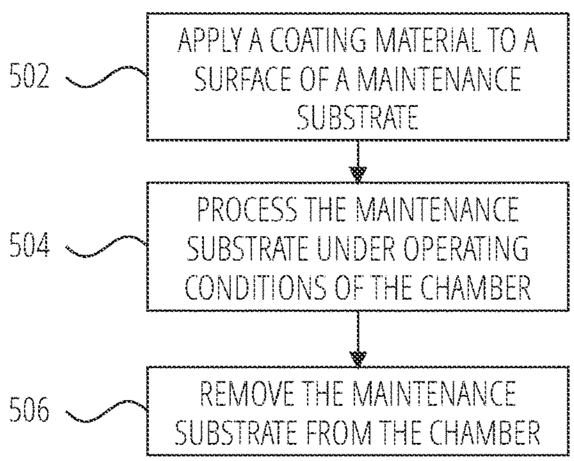

FIG. 5 is a flow diagram illustrating a method 500 for an in-situ coating process in accordance with another example embodiment. At block 502, a coating material 204 is applied to a surface of a maintenance substrate 202 (e.g., a wafer used in between processes to "refresh" the reactor system 200). At block 504, the reactor system 200 processes the maintenance substrate 202 under operating conditions of the process chamber 136. The process results in a coating material being applied to inner walls of the process chamber 136. At block 506, the maintenance substrate 202 is removed from the process chamber 136 prior to operating another wafer (under conventional operating conditions).

Figure 6:
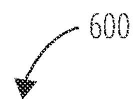
FIG. 6 is a flow diagram illustrating a method for an in-situ coating process in accordance with another example embodiment.
Figure 6:
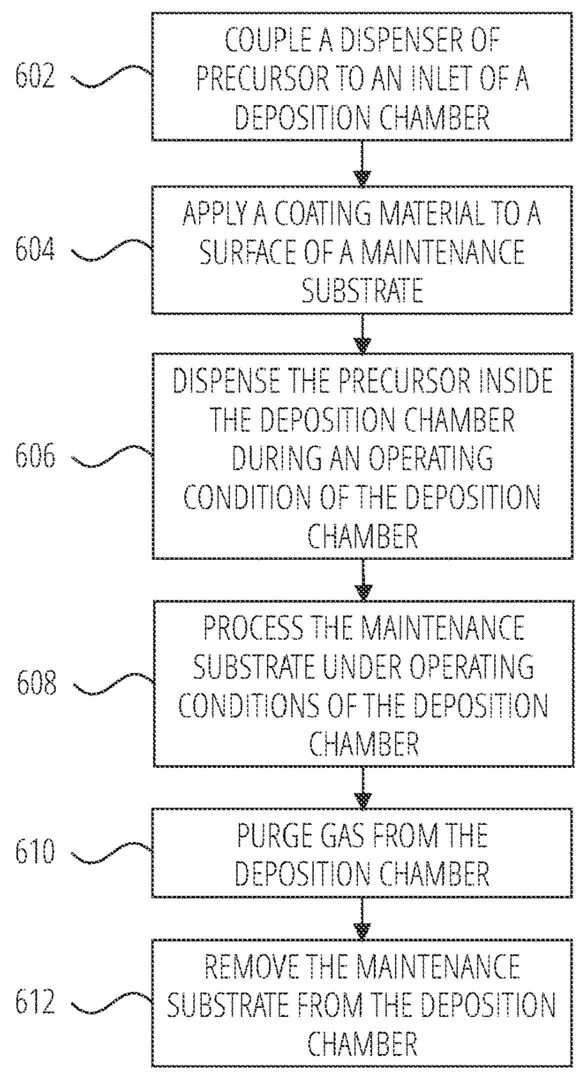

FIG. 6 is a flow diagram illustrating a method 600 for an in-situ coating process in accordance with another example embodiment. At block 602, a dispenser 114 is coupled to the gas inlet 124 of a process chamber 136. The dispenser 114 includes a coating material (e.g., a precursor). At block 604, a coating material 204 is applied to a surface of a maintenance substrate 202 (e.g., a wafer used in between processes to "refresh" the reactor system 200. At block 606, the dispenser 114 dispenses the coating material inside the process chamber 136 during an operating condition of the process chamber 136. At block 608, the reactor system 200 processes the maintenance substrate 202 under operating conditions of the process chamber 136. At block 610, gas inside the process chamber 136 is purged after the process (from the operating condition). At block 612, the maintenance substrate 202 is removed from the process chamber 136 prior to operating another substrate (under conventional operating conditions).

Figure 7:
FIG. 7 illustrates a routine 700 in accordance with one example embodiment.
Figure 7:
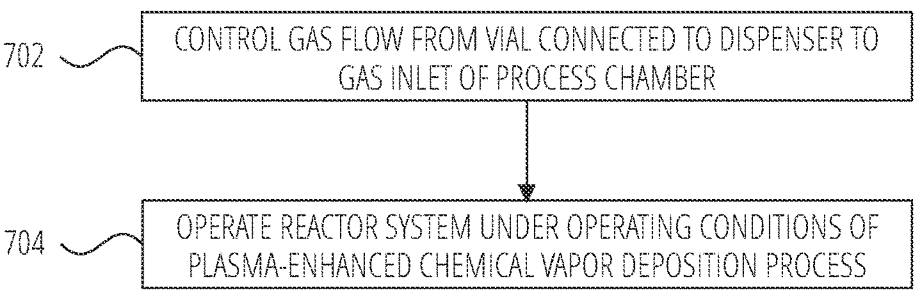

FIG. 7 illustrates a routine 700 in accordance with one example embodiment. In block 702, routine 700 controls a gas flow from a vial connected to a dispenser to a gas inlet of a process chamber, the vial comprising a coating material that, when released inside the process chamber under operating conditions of the reaction system, coats an inner wall of the process chamber. In block 704, routine 700 operates the reactor system under operating conditions of a plasma-enhanced chemical vapor deposition process.

Figure 8:
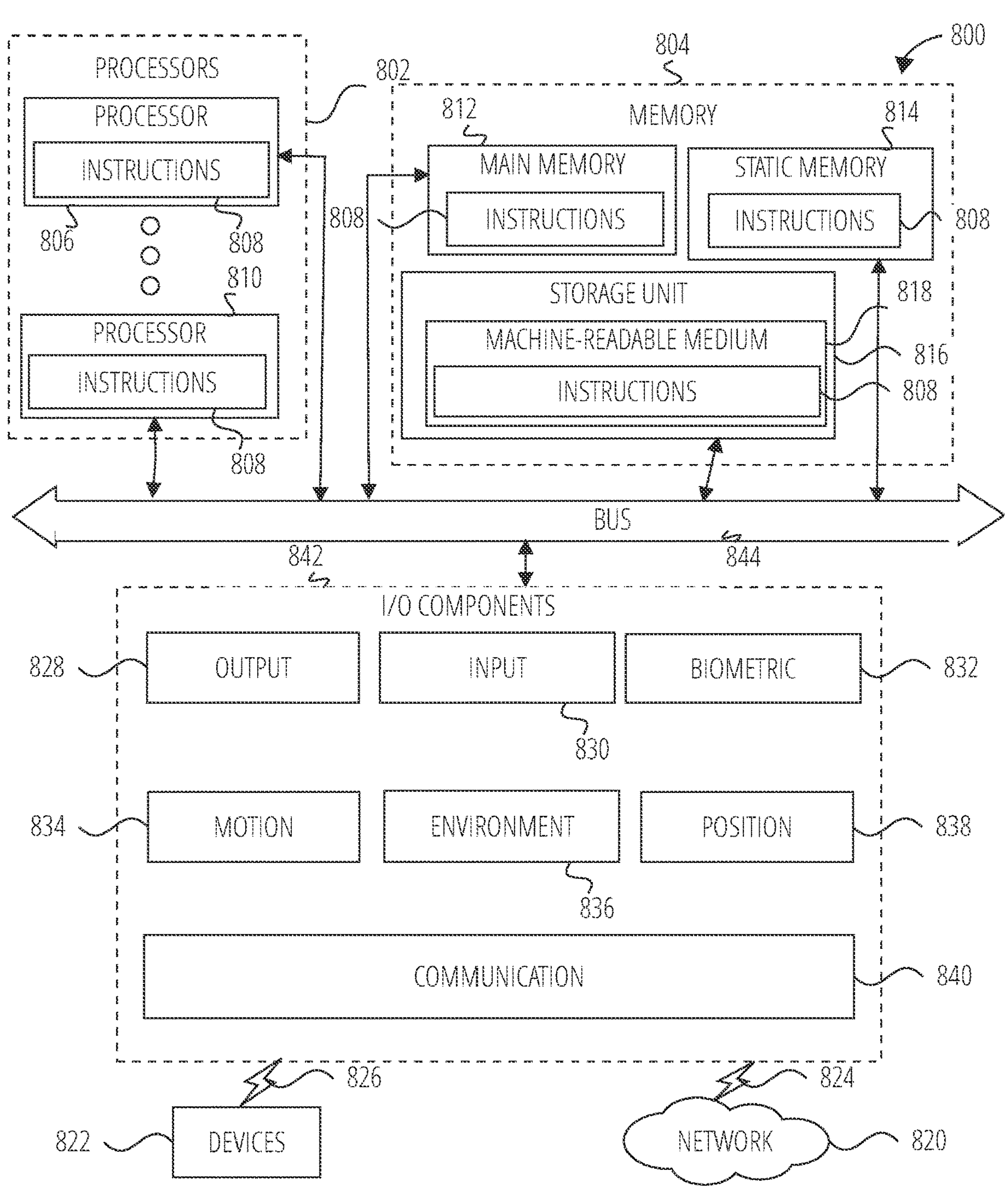
FIG. 8 is a diagrammatic representation of a machine in the form of a computer system within which a set of instructions may be executed for causing the machine to perform any one or more of the methodologies discussed herein, according to an example embodiment.

FIG. 8 is a diagrammatic representation of the machine 800 within which instructions 808 (e.g., software, a program, an application, an applet, an app, or other executable code) for causing the machine 800 to perform any one or more of the methodologies discussed herein may be executed. For example, the instructions 808 may cause the machine 800 to execute any one or more of the methods described herein. The instructions 808 transform the general, non-programmed machine 800 into a particular machine 800 programmed to carry out the described and illustrated functions in the manner described. The machine 800 may operate as a standalone device or may be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 808, sequentially or otherwise, that specify actions to be taken by the machine 800. Further, while only a single machine 800 is illustrated, the term "machine" shall also be taken to include a collection of machines that individually or jointly execute the instructions 808 to perform any one or more of the methodologies discussed herein.

The machine 800 may include processors 802, memory 804, and I/O components 842, which may be configured to communicate with each other via a bus 844. In an example embodiment, the processors 802 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 806 and a processor 810 that execute the instructions 808. The term "processor" is intended to include multi-core processors that may comprise two or more independent processors (sometimes referred to as "cores") that may execute instructions contemporaneously. Although FIG. 8 shows multiple processors 802, the machine 800 may include a single processor with a single core, a single processor with multiple cores (e.g., a multi-core processor), multiple processors with a single core, multiple processors with multiples cores, or any combination thereof.

The memory 804 includes a main memory 812, a static memory 814, and a storage unit 816, both accessible to the processors 802 via the bus 844. The main memory 804, the static memory 814, and storage unit 816 store the instructions 808 embodying any one or more of the methodologies or functions described herein. The instructions 808 may also reside, completely or partially, within the main memory 812, within the static memory 814, within machine-readable medium 818 within the storage unit 816, within at least one of the processors 802 (e.g., within the processor's cache memory), or any suitable combination thereof, during execution thereof by the machine 800.

The I/O components 842 may include a wide variety of components to receive input, provide output, produce output, transmit information, exchange information, capture measurements, and so on. The specific I/O components 842 that are included in a particular machine will depend on the type of machine. For example, portable machines such as mobile phones may include a touch input device or other such input mechanisms, while a headless server machine will likely not include such a touch input device. It will be appreciated that the I/O components 842 may include many other components that are not shown in FIG. 8. In various example embodiments, the I/O components 842 may include output components 828 and input components 830. The output components 828 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 830 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 842 may include biometric components 832, motion components 834, environmental components 836, or position components 838, among a wide array of other components. For example, the biometric components 832 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 834 include acceleration sensor components (e.g., accelerometer), gravitation sensor components, rotation sensor components (e.g., gyroscope), and so forth. The environmental components 836 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 838 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 842 further include communication components 840 operable to couple the machine 800 to a network 820 or devices 822 via a coupling 824 and a coupling 826, respectively. For example, the communication components 840 may include a network interface component or another suitable device to interface with the network 820. In further examples, the communication components 840 may include wired communication components, wireless communication components, cellular communication components. Near Field Communication (NFC) components, Bluetooth® components (e.g., Bluetooth® Low Energy), Wi-Fi® components, and other communication components to provide communication via other modalities. The devices 822 may be another machine or any of a wide variety of peripheral devices (e.g., a peripheral device coupled via a USB).

Moreover, the communication components 840 may detect identifiers or include components operable to detect identifiers. For example, the communication components 840 may include Radio Frequency Identification (UR)) tag reader components, NEC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 840, such as location via Internet Protocol (IP) geolocation, location via Wi-Fi® signal triangulation, location via detecting an NFC beacon signal that may indicate a particular location, and so forth.

The various memories (e.g., memory 804, main memory 812, static memory 814, and/or memory of the processors 802) and/or storage unit 816 may store one or more sets of instructions and data structures (e.g., software) embodying or used by any one or more of the methodologies or functions described herein. These instructions (e.g., the instructions 808), when executed by processors 802, cause various operations to implement the disclosed embodiments.

The instructions 808 may be transmitted or received over the network 820, using a transmission medium, via a network interface device a network interface component included in the communication components 840)) and using any one of a number of well-known transfer protocols (e.g., hypertext transfer protocol (HTTP)). Similarly, the instructions 808 may be transmitted or received using a transmission medium via the coupling 826 (e.g., a peer-to-peer coupling) to the devices 822.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be interrelated and each may be used separately or in combination with other particulate matter sensor calibration system embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims arc entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

EXAMPLES

Example 1 includes a reactor system comprising: a process chamber; a gas inlet connected to the process chamber; and a dispenser coupled to the gas inlet, the dispenser controls a gas flow from a vial to the gas inlet, the vial comprises a first coating material that, when released inside the process chamber under operating conditions of the reaction system, coats an inner wall of the process chamber.

Example 2 includes example 1, further comprising: a system controller having a processor and a memory that are communicatively connected with one another, the processor being operatively connected with the dispenser that controls the gas flow of the first coating material, the memory storing computer-executable instructions comprising: controlling the dispenser to release the first coating material inside the process chamber; and operating the reactor system under operating conditions of a plasma-enhanced chemical vapor deposition process.

Example 3 includes example 1, further comprising: a plurality of source gas lines connected to the gas inlet via a manifold, the manifold configured to combine source gases from the plurality of source gas lines and controlling a flow of the combined source gases; a top electrode in communication with a power supply; and a substrate support configured to receive a substrate, a system controller having a processor and a memory that are communicatively connected with one another, the processor being operatively connected with the manifold, the power supply, and the dispenser that controls the gas flow of the first coating material, the memory storing computer-executable instructions comprising: adjusting the flow of the combined source gases under operating conditions of a plasma-enhanced chemical vapor deposition process; controlling the dispenser to release the first coating material inside the process chamber; and operating the reactor system under operating conditions of a plasma-enhanced chemical vapor deposition process, Example 4 includes example 3, wherein adjusting the flow of the combined source gases comprises: preventing the flow of the combined source gases into the process chamber, Example 5 includes example 3, wherein adjusting the flow of the combined source gases comprises: combining the combined source gases with the first coating material into the process chamber.

Example 6 includes example 3, wherein the power supply comprises: a low frequency radio frequency (LFRF) generator; a high frequency radio frequency (HERE) generator; and a matching network, wherein the inner wall is formed from the group consisting of aluminum, ceramic, aluminum coated with ceramic, and aluminum coated with silicon carbide.

Example 7 includes example 3, wherein the substrate includes a maintenance wafer, the maintenance wafer comprises a second coating material that, when released inside the process chamber under operating conditions of the reaction system, combines with the first coating material and coats the inner wall of the process chamber.

Example 8 is a method comprising: controlling a gas flow from a vial connected to a dispenser to a gas inlet of a process chamber, the vial comprising a first coating material that, when released inside the process chamber under operating conditions of the reaction system, coats an inner wall of the process chamber; and operating the reactor system under operating conditions of a plasma-enhanced chemical vapor deposition process.

Example 9 includes example 8, wherein the reactor system comprises: a plurality of source gas lines connected to the gas inlet via a manifold, the manifold configured to combine source gases from the plurality of source gas lines and controlling a flow of the combined source gases; a top electrode in communication with a power supply; and a substrate support configured to receive a substrate, a system controller having a processor and a memory that are communicatively connected with one another, the processor being operatively connected with the manifold, the power supply, and the dispenser that controls the gas flow of the first coating material, the memory storing computer-executable instructions comprising: adjusting the flow of the combined source gases under operating conditions of a plasma-enhanced chemical vapor deposition process; controlling the dispenser to release the first coating material inside the process chamber; and operating the reactor system under operating conditions of a plasma-enhanced chemical vapor deposition process.

Example 10 includes example 9, wherein adjusting the flow of the combined source gases comprises: preventing the flow of the combined source gases into the process chamber.

Example 11 includes example 9, wherein adjusting the flow of the combined source gases comprises: combining the combined source gases with the first coating material into the process chamber.

Example 12 includes example 9, wherein the power supply comprises: a low frequency radio frequency (LFRF) generator; a high frequency radio frequency (HFRF) generator; and a matching network, wherein the inner wall is formed from the group consisting of aluminum, ceramic, aluminum coated with ceramic, and aluminum coated with silicon carbide.

Example 13 includes example 9, wherein the substrate includes a maintenance wafer, the maintenance wafer comprises a second coating material that, when released inside the process chamber under operating conditions of the reaction system, coats the inner wall of the process chamber.

Example 14 is a non-transitory computer-readable storage medium, the computer-readable storage medium including instructions that when executed by a computer, cause the computer to perform operations comprising: controlling a gas flow from a vial connected to a dispenser to a gas inlet of a process chamber, the vial comprising a first coating material that, when released inside the process chamber under operating conditions of the reaction system, coats an inner wall of the process chamber; and operating the reactor system under operating conditions of a plasma-enhanced chemical vapor deposition process.

Example 15 includes example 14, wherein the reactor system comprises: a plurality of source gas lines connected to the gas inlet via a manifold, the manifold configured to combine source gases from the plurality of source gas lines and controlling a flow of the combined source gases; a top electrode in communication with a power supply; and a substrate support configured to receive a substrate, wherein the operations comprise: adjusting the flow of the combined source gases under operating conditions of a plasma-enhanced chemical vapor deposition process; controlling the dispenser to release the first coating material inside the process chamber; and operating the reactor system under operating conditions of a plasma-enhanced chemical vapor deposition process.

Example 16 includes example 15, wherein adjusting the flow of the combined source gases comprises: preventing the flow of the combined source gases into the process chamber.

Example 17 includes example 15, wherein adjusting the flow of the combined source gases comprises: combining the combined source gases with the first coating material into the process chamber.

Example 18 includes example 15, wherein the power supply comprises: a low frequency radio frequency (LFRF) generator; a high frequency radio frequency (HFRF) generator; and a matching network.

Example 19 includes example 14, wherein the inner wall is formed from the group consisting of aluminum, ceramic, aluminum coated with ceramic, and aluminum coated with silicon carbide.

Example 20 includes example 15, wherein the substrate includes a maintenance wafer, the maintenance wafer comprises a second coating material that, when released inside the process chamber under operating conditions of the reaction system, coats the inner wall of the process chamber.

What is claimed is:

1. A reactor system comprising:

a process chamber a gas inlet connected to the process chamber;

a dispenser coupled to the gas inlet, the dispenser configured to deliver a gas flow of a first coating material from a vial into the process chamber, the first coating material configured to form a coating on an inner surface of the process chamber under operating conditions of a plasma-enhanced chemical vapor deposition chamber-wall coating cycle, the coating to reduce deposit buildup on the inner surface, the first coating material comprising trimethylaluminum (TMA), magnesium, zinc, or a fluorine-containing compound or solvent; and a substrate support configured to receive a maintenance wafer having a second coating material releasable under operating conditions of the plasma-enhanced chemical vapor deposition chamber-wall coating cycle, the second coating material comprising magnesium or zinc, wherein during the plasma-enhanced chemical vapor deposition chamber-wall coating cycle, the first coating material is introduced into the process chamber via the gas inlet, the second coating material is released from the maintenance wafer, and the first and second coating materials form the coating on the inner surface of the process chamber.

2. The reactor system of claim 1, further comprising:

a system controller having a processor and a memory that are communicatively coupled with one another, the processor being operatively coupled with the dispenser to control introduction of the first coating material during the plasma-enhanced chemical vapor deposition chamber-wall coating cycle, the memory storing computer-executable instructions comprising instructions to:

cause the dispenser to introduce the first coating material into the process chamber via the gas inlet; and operate the reactor system under operating conditions of a plasma-enhanced chemical vapor deposition chamber-wall coating cycle.

3. The reactor system of claim 1, further comprising:

a plurality of source gas lines coupled to the gas inlet via a manifold, the manifold configured to combine source gases from the plurality of source gas lines and control a flow of the combined source gases;

a top electrode in communication with a power supply;

a substrate support configured to receive a substrate including the maintenance wafer; and a system controller having a processor and a memory that are communicatively coupled with one another, the processor being operatively coupled with the manifold, the power supply, and the dispenser to introduce the first coating material, the memory storing computer-executable instructions comprising instructions to:

adjust the flow of the combined source gases under operating conditions of a plasma-enhanced chemical vapor deposition chamber-wall coating process;

cause the dispenser to introduce the first coating material into the process chamber; and operate the reactor system under operating conditions of a plasma-enhanced chemical vapor deposition chamber-wall coating cycle.

4. The reactor system of claim 3, wherein adjusting the flow of the combined source gases comprises:

preventing the flow of the combined source gases into the process chamber during the plasma-enhanced chemical vapor deposition chamber-wall coating cycle.

5. The reactor system of claim 3, wherein adjusting the flow of the combined source gases comprises:

combining the combined source gases with the first coating material and introducing them into the process chamber during the plasma-enhanced chemical vapor deposition chamber-wall coating cycle.

6. The reactor system of claim 3, wherein the power supply comprises:

a low frequency radio frequency (LFRF) generator;

a high frequency radio frequency (HFRF) generator; and a matching network, wherein the inner surface of the process chamber is formed from a group consisting of aluminum, ceramic, aluminum coated with ceramic, and aluminum coated with silicon carbide.

* * * * *